US006504777B1

United States Patent
Hsu et al.

(10) Patent No.: US 6,504,777 B1
(45) Date of Patent: Jan. 7, 2003

(54) ENHANCED BITLINE EQUALIZATION FOR HIERARCHICAL BITLINE ARCHITECTURE

(75) Inventors: Louis Lu-Chen Hsu, Fishkill, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/924,661

(22) Filed: Aug. 8, 2001

(51) Int. Cl.[7] .............................................. G11C 7/00
(52) U.S. Cl. ..................... 365/205; 365/202; 365/214
(58) Field of Search ................................ 365/190, 202, 365/205, 207, 214

(56) References Cited

U.S. PATENT DOCUMENTS 6,191,990 B1 * 2/2001 Itoh et al. .................... 365/149
6,337,824 B1 * 1/2002 Kono et al. .................. 365/205

* cited by examiner

Primary Examiner—Richard Elms
Assistant Examiner—VanThu Nguyen
(74) Attorney, Agent, or Firm—Scully, Scott, Murphy & Presser; Robert M. Trepp, Esq.

(57) ABSTRACT

In a high density dynamic memory circuit, the sense amplifiers are shared by several bitlines in order to maintain a high density and low power design. However, the bitline equalization level drifts after several cycles of operation, caused by an unbalanced capacitance resulting from a size difference of n-FET and p-FET latches in the sense amplifiers. An extra compensating capacitance Ce is added to the NCS node to adjust the loading capacitance to eliminate the bitline drifting.

13 Claims, 2 Drawing Sheets

ENHANCED BITLINE EQUALIZATION FOR HIERARCHICAL BITLINE ARCHITECTURE

BACKGROUND OF THE INVENTION

1. Field of the Invention

The present invention relates generally to an enhanced bitline equalization for hierarchical bitline architecture, and more particularly pertains to an enhanced bitline equalization for a hierarchical bitline architecture for high speed, high density and low power DRAM memories. The enhanced bitline equalization is designed to eliminate drifting of the bitline potential from the equilibrium voltage Vbleq caused by bitline unbalanced capacitances.

2. Discussion of the Prior Art

In a modern high density and low power memory design, using a hierarchical bitline architecture can increase the density of the memory array. A hierarchical bitline architecture allows more bitline pairs to share a common sense amplifier. Non-active bitlines are left floating except during a precharge and equalization period. During this period, the precharge devices must have the capability and be large enough to precharge all of the bitline pairs at once. However, large precharge devices can consume a substantial amount of power and require very large device sizes in order to perform this process within a reasonable period of time.

In the design of a conventional memory array, the precharge device is normally fabricated inside the sense amplifier, and is isolated by switch devices from all of the bitlines that are connected to it. The precharge devices are inherently not strong enough when the array size is large, and the Vbleq (bitline equalization) voltage is weakened and lower when it reaches the far end edge of the memory array. In this case, the floating bitlines are difficult to bring to the equalization voltage level, and also the active bitlines are difficult to equalize during the precharge period.

During the equalization period, an equalization voltage EQL is turned on first, so that Vbleq is supplied to the sense amplifier circuit. This process effectively brings the bitlines to the equalization level. Shortly thereafter, a dateline equalization voltage LDQEQ is turned on to equalize the GLDQ wirings. The reason for doing this is that the Vbleq supply is not strong enough to simultaneously bring all of the bitlines and the global DQ data buses to the equalization level.

In a conventional dynamic memory design, each sense amplifier is shared by many pairs of bitlines and the sense amplifier becomes weaker during the PC/EQ (precharge and equalization) period if the PC/EQ device components are also shared. Simulation test results indicate that the bitline equalization level drifts from cycle to cycle and finally saturates at an equilibrium value.

The cause of this drift is primarily attributed to the unbalanced bitline capacitance between the bitline pairs. To be more specific, the pFET device size in the latch circuit of the sense amplifier is more than twice the size of the NFET device in the latch circuit due to an inherently weaker driveability of the pFET device. Therefore, the capacitance load of the PCS node, which is connected to many sense amplifiers in the same block, is larger than the capacitance load of the NCS node, which is also connected to many sense amplifiers in the same block, due to the difference in device sizes. This effect in some bitline data patterns is further enhanced by a bitline loading mismatch and is thus reflected in the final voltage equalization level. This voltage level can be significantly different from the Vbleq (supplied equilibrium voltage), which is the equilibrium voltage of the bitlines before the onset of sensing.

Because the capacitive loading in the circuit is strongly voltage dependent, it is very difficult to avoid this drifting unless a stronger PC/EQ (precharge and equalization) component is used for each bitline pair, which is undesirable.

SUMMARY OF THE INVENTION

Accordingly, it is a primary object of the present invention to provide an enhanced bitline equalization for a hierarchical bitline architecture.

The present invention provides a new bitline sensing and balancing circuit for high speed, high density and low power DRAM memories which uses a bitline balancing technique designed to eliminate drifting of the bitline potential from the equilibrium voltage Vbleq caused by bitline unbalanced capacitances.

The drifting of the bitline potential from the equilibrium voltage Vbleq is reduced by adding an extra compensating capacitance element, such as a compensating capacitance element formed by conductor electrodes between the dielectric or in the FET structure, to equalize the capacitance loading between the NCS and PCS nodes of the sense amplifiers to eliminate drifting of the bitline balancing voltage. This results in a sense amplifier circuit with less devices, a high sensing speed and a lower power consumption.

Sensing signal noise can also be reduced by setting the timing of the EQ signal earlier than the MUX signal, and by the proper sizing of equalization devices.

BRIEF DESCRIPTIONS OF THE DRAWINGS

The foregoing objects and advantages of the present invention for an enhanced bitline equalization for a hierarchical bitline architecture may be more readily understood by one skilled in the art with reference being had to the following detailed description of the several preferred embodiments thereof, taken in conjunction with the accompanying drawings wherein like elements are designated by identical reference numerals throughout the several views, and in which.

DETAILED DESCRIPTION OF THE DRAWINGS

Tests have indicated that setting the timing of the equalization signal EQ earlier than the multiplex signal MUX helps to reduce the coupling problem, while setting the timing of the EQ signal later than or equal to the MUX signal results in higher levels of switching noise. Thus switching noise can be eliminated or reduced by introducing the EQ signal timing earlier than the arrival of the MUX signal.

The drifting of the bitline equalize potential level drifting can also be minimized by adjusting the EQ device sizes. For example, the drifting phenomena disappeared when the EQ devices had a width W=1.5um. This is caused by the charge sharing effect of the EQ devices with the bitlines. The bitline balance has been changed by the different sizes of the EQ devices.

Figure 1:
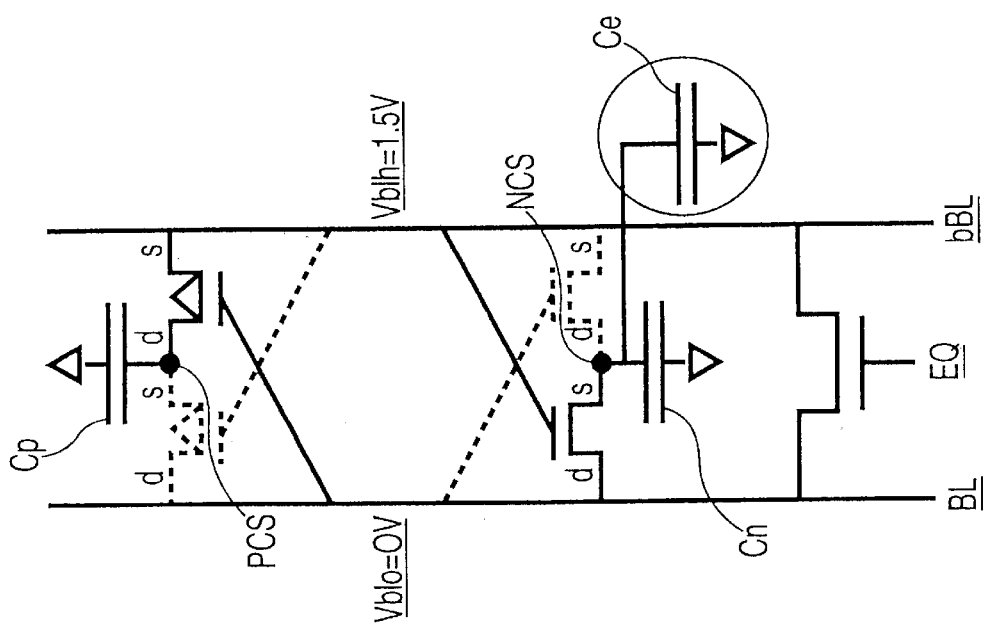
FIG. 1 illustrates a method to enhance bitline equalization for hierarchical bitline architecture which reduces the bitline imbalance by adding an extra capacitor device Ce to the NCS node of a sense amplifier unit.

This can be explained in a schematic diagram of the sense amplifier circuit at the stage after sensing but immediately before equalization, as shown by FIG. 1 which illustrates one principle for charge balancing in a sense amplifier.

The simplest way to eliminate the bitline imbalance problem with fixed PC/EQ devices is to adjust the EQ device sizes. However since a PC/EQ device is required for each pair of bitlines, reducing the bitline imbalance by using larger size PC/EQ devices not only slows down the circuit but also consumes extra power.

FIG. 1 illustrates a more ideal approach to reducing the bitline imbalance, which is to add an extra capacitor device Ce to the NCS node of a sense amplifier unit. The extra capacitor device Ce can be fabricated using diffusion, a conducting electrode layer or dielectric layer, or FET devices. The addition of the extra capacitor Ce to the NCS node makes the NCS and PCS nodes, which are connected to all of the sense amplifiers in the memory block, have the same capacitance load. Thus the drifting of the balancing voltage on the bitlines away from Vbleq can be totally eliminated. This approach not only reduces the time to perform bitline balancing but also reduces the need for the PC/EQ devices, making them unnecessary.

A semiconductor memory circuit typically comprises a large number of memory arrays.

Typically one sense amplifier block is shared by a pair of memory arrays and comprises a plurality of sense amplifier units.

As illustrated in FIG. 1, each sense amplifier unit typically comprises an nMOS cross-couple sense component and a pMOS cross-couple sense component, and an equalization device. The cross-couple sense device 40 includes an n-type latch which is switched by an NSET signal, and a p-type latch which is switched by a PSET signal.

The nMOS and pMOS cross-couple sense components sense and amplify a signal developed on a pair of adjacent bitlines BL, bBL during a sensing period. The sense amplifier unit equalizes the pair of bitlines during an equalization period to a mid-point between a bitline high voltage level and a bitline low voltage level. Because of the inherently weaker driveability of the pMOS device, the pMOS cross-couple sense component is typically 2 to 3 times larger than the size of the nMOS cross-coupled sense component.

The pMOS cross-couple sense component comprises a first pMOS device and a second pMOS device, and the source of the first pMOS device and the drain of the second pMOS device are connected to a p type sense node PCS. The drain of the first pMOS device and the source of the second pMOS device are connected respectively to the first bitline BL and the second bitline bBL, and the gate of the first pMOS device and the gate of the second pMOS device are connected respectively to the second bitline and the first bitline.

Similarly, the nMOS cross-couple sense component comprises a first nMOS device and a second nMOS device, and the source of the first nMOS device and the drain of the second nMOS device are connected to an n type sense node NCS. The drain of the first nMOS device and the source of the second nMOS device are connected respectively to the first bitline BL and the second bitline bBL, and the gate of the first nMOS device and the gate of the second nMOS device are connected respectively to the second bitline and the first bitline.

The parasitic capacitance Cn of the n type sense node is connected to an equalization device comprising an added capacitor Ce with a size that substantially equalizes the total capacitance of the n type sense node NCS and the p type sense node PCS.

The added capacitance Ce can be a metal wiring parasitic capacitance formed by a metal to metal capacitance, or a polysilicon wiring parasitic capacitance formed by a polysilicon to diffusion junction capacitance. Alternatively, the added capacitance can be a device parasitic capacitance formed by a device gate capacitance, or a diffusion parasitic capacitance formed by a diffusion junction capacitance.

Figure 2:
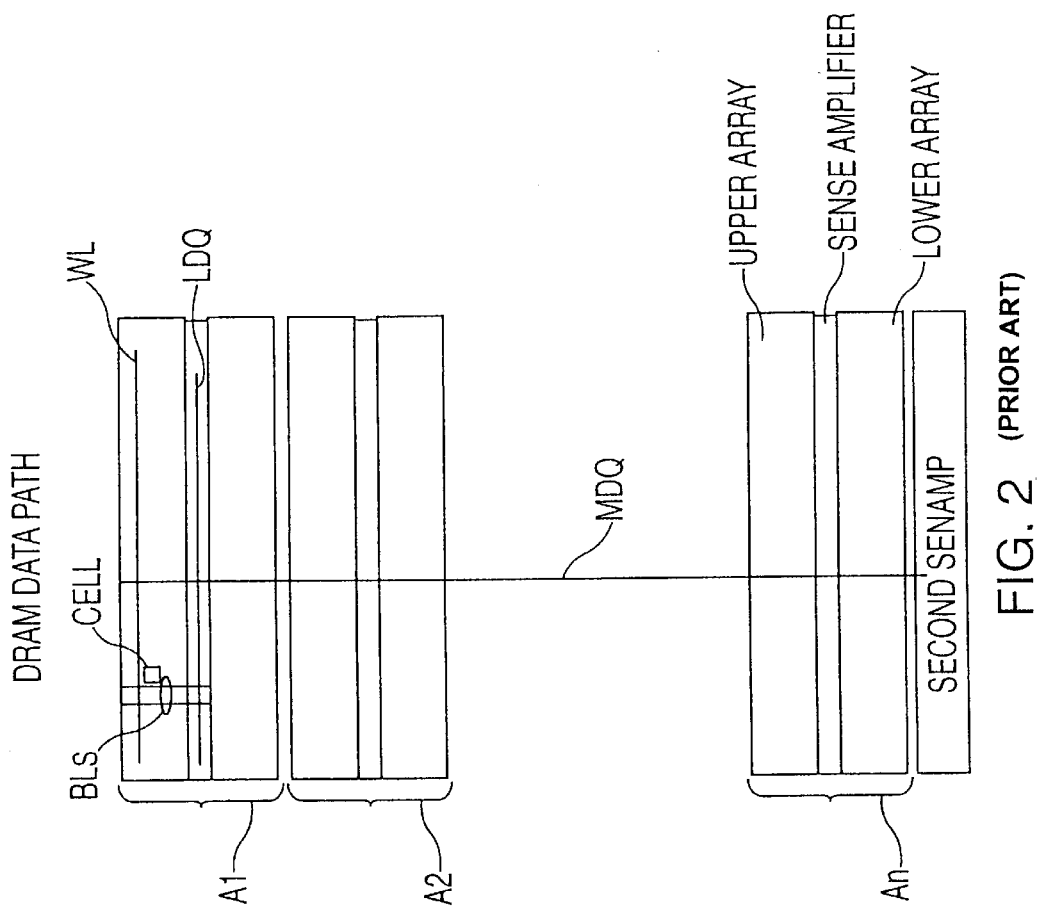
FIG. 2 is a top view of a data path in a conventional DRAM memory array.

FIG. 2 is a top view of a data path in a conventional DRAM memory array. If data stored in a Cell is to be retrieved, the corresponding wordline WL is activated. The whole row of data, including the data in the targeted cell, is read to a first Sense Amplifier SA located between an upper memory array and a lower memory array. A first sense amplifier is shared by upper and lower memory arrays in each DRAM block A1, A2 . . . An, for n blocks of arrays. Assume that the data is located in the upper array of the first block, as shown in FIG. 2. For a folded bitline architecture, one bitline BL that is connected to the data cell is sensed while using an adjacent bitline bBL as a reference bitline. Therefore, a pair of bitlines BL, bBL are connected to the first sense amplifier SA.

If the data stored in the cell is a "high", during sensing the true bitline BL will swing from Vbleq, a BL voltage equalization level, typically ½ of Vblh (the bitline high voltage level), to Vblh (the bitline high voltage level).

To save area, the first sense amplifier is typically shared by an upper memory array and a lower memory array. In operation, if the sense amplifier is being used by the upper memory array, an MUX switch coupled to the lower array is turned off, and vice versa.

The data amplified by the first sense amplifier SA is then sent to a secondary sense amplifier SSA via a local data line LDQ to a master data line MDQ. If only part of the data in a row (for example, 1/m) is to be sent out, a column decoder is used to select 1/m data from the first sense amplifier SA to send to the secondary sense amplifier SSA. Data switches are conventionally present in the first sense amplifiers as well as along the data lines.

Figure 3:
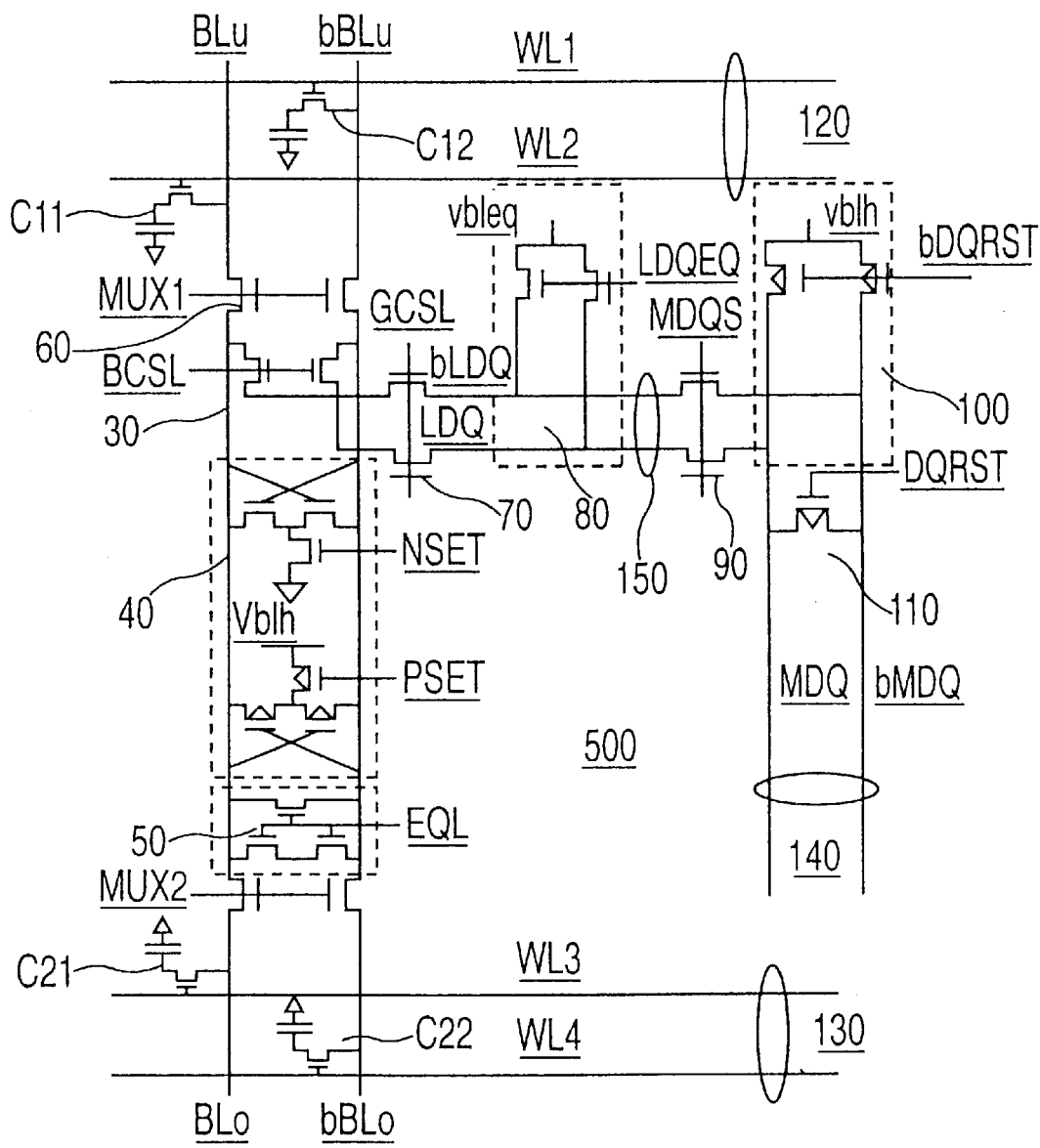
FIG. 3 is a more detailed circuit schematic of a conventional DRAM memory array.

FIG. 3 is a more detailed circuit schematic of a conventional DRAM memory array. Two wordlines WL1, WL2 are shown in an upper memory array 120, and two wordlines WL3, WL4 are shown in the lower memory array 130. A pair of bitlines Blu and bBLu are shown in the upper array, and a pair of bitlines Blo and bBLo are shown in the lower array.

A first sense amplifier SA comprises an upper switch MUX 1, a lower switch MUX 2, a data switch BCSL 30, a cross-couple typed sense amplifier 40, similar to that of FIG. 1, and a precharge and equalization device 50. The cross-couple sense device 40 includes an n-type latch which is switched by an NSET signal, and a p-type latch which is switched by a PSET signal.

In the precharge and equalization device 50, one nMOS device links two bitlines together, and two MOS devices are used for precharge during the precharge period, to allow both bitlines to be precharged to the Vbleq level. If the precharge devices are small and weak, most of the equalization function is handled by the equalization device 50 within the precharge and equalization period.

The data is first amplified and then sent to the local data lines LDQs 150. At that moment, the LDQ switches 70 must be opened by a signal GCSL. Similarly, while data is sent to the master data lines MDQ 140, the MDQ switch 90 must be opened by a signal MDQS. Both LDQ and MDQ (local and master data lines) have their own equalization devices, 80 and 100, respectively. Note that LDQ is precharged to Vbleq, while MDQ is precharged to Vblh. In other words, unlike the first sense amplifier, the second sense amplifier SSA uses Vdd sensing in this example.

During the precharge/equalization period, all of the MUX switches are shut off. Each equalization device 50, 80, 100 is used to precharge/equalize its own circuit. However, the equalization device 50 of the first sense amplifier, which is used to equalize the first amplifier, is also used to equalize the bitlines BLs. Otherwise, each pair of bitlines would need their own equalization device which would result in a huge chip size increase.

Considering the design of the first sense amplifier SA, because the electron mobility is about 2X faster than the hole mobility, the n-latch size is smaller than the p-latch size. This arrangement helps sensing both the high signal and the low signal with equal speed. But, during equalization, if the precharge device 50 is weak, the equalization will not be able to bring both bitlines to the precharge middle point.

This can be solved by increasing the size of the precharge device, or by increasing the cycle time, so that the bitlines will have sufficient time to be precharged and equalized to the right precharge/equalization voltage. This is not a desirable solution since the chip size will be increased, or the performance will be compromised.

Therefore, the present invention balances the unbalanced capacitance by adding an extra compensating capacitance Ce to the NCS node, as illustrated in FIG. 1, so that when the pair of bitlines are brought together, the voltage level will be naturally equalized at the middle voltage between Vblh and ground by the charge sharing effect. The extra capacitor can be a gate capacitor, a trench capacitor, or a metal parasitic capacitor based upon the principle that no (or the least) extra area or cost is incurred.

While several embodiments and variations of the present invention for an enhanced bitline equalization for a hierarchical bitline architecture are described in detail herein, it should be apparent that the disclosure and teachings of the present invention will suggest many alternatives designs to those skilled in the art.

Having thus described our invention, what we claim as new, and desire to secure by Letters Patent is:

1. A semiconductor memory circuit comprising:
    at least one pair of memory arrays;
    at least one sense amplifier block shared by said pair of memory arrays and comprising a plurality of sense amplifier units, each sense amplifier unit comprising an nMOS cross-couple sense component comprising a pair of nMOS devices coupled together at an n type sense node, a pMOS cross-couple sense component comprising a pair of pMOS devices coupled together at a p type sense node, and an equalization device comprising a capacitance, coupled to the n type sense node, with a size that substantially equalizes the total capacitance of the n type sense node and the p type sense node.

2. The semiconductor memory circuit of claim 1, wherein the nMOS and pMOS cross-couple sense components sense and amplify a signal developed on a pair of adjacent bitlines, comprising a first bitline and a second bitline, during a sensing period.

3. The semiconductor memory circuit of claim 2, wherein the equalization device of the sense amplifier unit equalizes the pair of adjacent bitlines during an equalization period to a mid-point between a bitline high voltage level and a bitline low voltage level.

4. The semiconductor memory circuit of claim 1, wherein the pMOS cross-couple sense component is substantially 2 to 3 times larger than the size of the nMOS cross-couple sense component.

5. The semiconductor memory circuit of claim 2, wherein the pMOS cross-couple sense component comprises a first pMOS device and a second pMOS device, the source of the first pMOS device and the drain of the second pMOS device are connected to the p type sense node, the drain of the first pMOS device and the source of the second pMOS device are connected respectively to the first bitline and the second bitline, and the gate of the first pMOS device and the gate of the second pMOS device are connected respectively to the second bitline and the first bitline.

6. The circuit semiconductor memory of claim 5, wherein the nMOS cross-couple sense component comprises a first nMOS device and a second nMOS device, the source of the first nMOS device and the drain of the second nMOS device are connected to the n type sense node, the drain of the first nMOS device and the source of the second nMOS device are connected respectively to the first bitline and the second bitline, and the gate of the first nMOS device and the gate of the second nMOS device are connected respectively to the second bitline and the first bitline.

7. The semiconductor memory circuit of claim 6, wherein the parasitic capacitance of the n type sense node is connected to the equalization device which comprises a capacitance with a size that substantially equalizes the total capacitance of the n type sense node and the p type sense node.

8. The semiconductor memory circuit of claim 7, wherein the capacitance is a metal wiring parasitic capacitance formed by a metal to metal capacitance.

9. The semiconductor memory circuit of claim 7, wherein the capacitance is a polysilicon wiring parasitic capacitance formed by a polysilicon to diffusion junction capacitance.

10. The semiconductor memory circuit of claim 7, wherein the capacitance is a device parasitic capacitance formed by a device gate capacitance.

11. The semiconductor memory circuit of claim 7, wherein the capacitance is a diffusion parasitic capacitance formed by a diffuision junction capacitance.

12. A bitline sensing and balancing circuit for a high speed, high density and low power DRAM memory array comprising:
    a DRAM memory array comprising a plurality of memory cells;
    a plurality of wordlines coupled to the DRAM memory array for accessing data stored therein;
    a plurality of bitlines coupled to the DRAM memory array for accessing data stored therein;
    a plurality of sense amplifiers coupled across pairs of bitlines wherein a first bitline of the bitline pair is a true sense bitline and a second bitline of the bitline pair is a reference bitline;
    each sense amplifier includes an n-type latch which is switched by an NSET signal, and a p-type latch which is switched by a PSET signal, wherein the n-type latch size is smaller than the p-type latch size, for sensing both a high signal and a low signal with equal speed, which provides an unbalanced capacitance between the n-type latch and the p-type latch;
    a compensating capacitance is coupled to the NCS node to balance the unbalanced capacitance, and when a pair of bitlines are coupled together, the voltage level thereon will equalize at a middle voltage between the bitline high voltage Vblh and ground by a charge sharing effect.

13. The bitline sensing and balancing circuit for a high speed, high density and low power DRAM memory array of claim 12, wherein each sense amplifier includes an equalization device which receives an equalization signal EQ to supply an equilibrium voltage to the sense amplifier, and each sense amplifier is shared between a first memory array and a second memory array by multiplexer switches, each of which is switched in response to a multiplex signal MUX to switch the sense amplifier between the first memory array and the second memory array, and wherein the equalization signal EQ is timed earlier than the multiplex signal MUX to reduce signal sensing noise.

* * * * *